(12) United States Patent
Mukherjee et al.

(10) Patent No.: US 10,978,996 B2
(45) Date of Patent: Apr. 13, 2021

(54) OSCILLATOR APPARATUS

(71) Applicant: TEXAS INSTRUMENTS INCORPORATED, Dallas, TX (US)

(72) Inventors: Subhashish Mukherjee, Bangalore (IN); Kumar Anurag Shrivastava, Bangalore (IN); Madhulatha Bonu, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/670,741

(22) Filed: Oct. 31, 2019

(65) Prior Publication Data
US 2020/0067453 A1 Feb. 27, 2020

Related U.S. Application Data

(63) Continuation of application No. 15/173,044, filed on Jun. 3, 2016, now Pat. No. 10,483,909.

(51) Int. Cl.
| H03B 5/06 | (2006.01) |
| H03B 5/04 | (2006.01) |
| H03B 5/12 | (2006.01) |
| H03L 7/00 | (2006.01) |
| H03L 3/00 | (2006.01) |

(52) U.S. Cl.
CPC ............... *H03B 5/06* (2013.01); *H03B 5/04* (2013.01); *H03B 5/1221* (2013.01); *H03B 5/1234* (2013.01); *H03L 3/00* (2013.01); *H03L 7/00* (2013.01)

(58) Field of Classification Search
CPC ...... H03B 5/1221; H03B 5/1234; H03B 5/04; H03B 5/06; H03L 3/00; H03L 7/00

USPC ............... 331/154, 116 M, 167, 117 FE
See application file for complete search history.

(56) References Cited

U.S. PATENT DOCUMENTS

| 5,936,445 A | 8/1999 | Babanezhad et al. |
| 10,483,909 B2 * | 11/2019 | Mukherjee ............ H03B 5/1221 |
| 2007/0132521 A1 | 6/2007 | Lee et al. |
| 2014/0070899 A1 | 3/2014 | Liu et al. |

OTHER PUBLICATIONS

"LC Oscillators and Types," www.circuitstoday.com/lc-oscillators-and-types, Feb. 4, 2014, 11 pages.

* cited by examiner

*Primary Examiner* — Arnold M Kinkead
(74) *Attorney, Agent, or Firm* — Valerie M. Davis; Charles A. Brill; Frank D. Cimino

(57) ABSTRACT

Methods and apparatus generate an oscillating output signal having a voltage swing greater than a voltage swing across nodes of active devices. An example oscillator includes a tank to generate an oscillating output signal in response receiving an edge of an enable signal; a feedback generator including a first gain stage forming a first feedback loop with the tank, the first feedback loop providing a first charge to maintain the oscillating output signal and a second gain stage forming a second feedback loop with the tank, the second feedback loop providing a second charge to maintain the oscillating output signal, the first and second charges combining with the oscillating output signal to generate a high voltage swing; and an attenuator connected between the tank and the feedback generator to isolate the tank from active components of the feedback generator.

28 Claims, 5 Drawing Sheets

OSCILLATOR APPARATUS

CROSS-REFERENCE TO RELATED APPLICATION

This application is a continuation of U.S. patent application Ser. No. 15/173,044 filed Jun. 3, 2016, and issued on Nov. 19, 2019 as U.S. Pat. No. 10,483,909, the entirety of which is incorporated herein by reference.

BACKGROUND

This relates generally to oscillators, and more particularly to methods and apparatus for generating a high swing in an oscillator.

Oscillators generate voltage signals that oscillate at a particular phase and frequency. In some examples, oscillators are used in communication systems and/or control systems for generation of a carrier wave. Carrier waves are embedded with data and transmitted to a receiver to decode and/or demodulate the data within a received carrier wave. Oscillators can be used in systems which require low jitter and phase noise and/or stable performance across variations in supply voltage, temperature, and/or semiconductor processes.

SUMMARY

An example apparatus includes a tank to generate an oscillating output signal in response receiving an of an enable signal. Such an example apparatus includes a feedback generator including a first gain stage forming a first feedback loop with the tank, the first feedback loop providing a first charge to maintain the oscillating output signal and a second gain stage forming a second feedback loop with the tank, the second feedback loop providing a second charge to maintain the oscillating output signal, the first and second charges combining with the oscillating output signal to generate a high voltage swing. Such an example apparatus includes attenuator connected between the tank and the feedback generator to isolate the tank from active components of the feedback generator.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION OF EXAMPLE EMBODIMENTS

Figure 1:
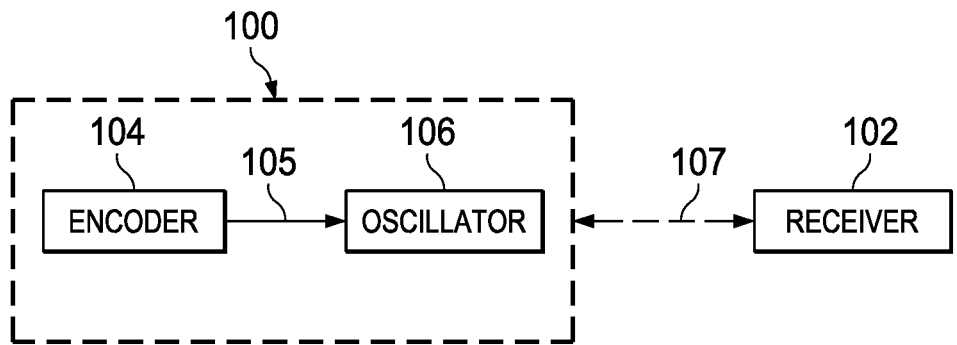
FIG. 1 is an illustration including an example transmitter to transmit a carrier wave to an example receiver using an example oscillator.

Communication systems may use oscillators to facilitate communication of signals between two or more systems that are electrically isolated, or have different voltage references. In such communication systems, the isolated systems may communicate through capacitive or inductive coupling using carrier based modulation schemes (e.g., using phase shift keying, frequency shift keying, amplitude shift keying, on-off keying, and/or any other type of modulation and/or keying) in which data is embedded in a carrier signal. In some examples, an RC (resistor capacitor) oscillator, an LC (inductor capacitor) oscillator, a VCO (voltage controlled oscillator), etc. may be used to generate a high frequency carrier signal using such carrier based modulation schemes. The carrier signal is wirelessly transmitted from a first system to a second system using inductive coupling, capacitive coupling, and/or an antenna.

The durability (e.g., power and/or signal-to-noise ratio) of a carrier signal corresponds to the voltage swing of the carrier signal. The voltage swing is a voltage differential between the maximum voltage of an oscillating signal and the minimum voltage of the oscillating signal (e.g., the peak-to-peak voltage). Although a high voltage swing to increase the power and signal-to-noise ratio of a carrier signal is desirable, the voltage swing of a carrier signal generated by conventional oscillators is limited by the breakdown voltage requirements of active components (e.g. transistors) used to maintain oscillation in the tank of the conventional oscillators. For example, if the breakdown voltage associated with the transistors in an oscillator is 1.8V, then the maximum swing is 3.6V (e.g., −1.8V to 1.8V). Using examples described herein, the maximum swing can be increased levels much higher than a supply voltage of the oscillator without the risk of damage to the transistors associated with operating the transistors at a voltage higher than the breakdown voltage.

Examples described herein utilize capacitors to isolate the active components (e.g., transistors) in the oscillator from the passive components (e.g., inductors, capacitors, etc.) in a tank of the oscillator. As further described below, a tank is an electrical device including passive components (e.g., inductors, capacitors, resistors, etc.) that, when provided with charge, generate an oscillating signal. The example tank may be an RC tank, an LC, and/or any other type of tank. In some examples, an oscillation starter device is utilized to (A) provide the initial charge (e.g., via a rising edge of a step voltage) and (B) control a two-stage feedback generator. For example, if the oscillator encodes a carrier wave with data using an on-off keying modulation scheme, the oscillation starter device will output an enable voltage for a duration of time to initiate an oscillating signal and output 0 Volts (V) for a duration of time to cease the oscillating signal. In such examples, the series of oscillations/non-oscillations creates a carrier wave that is wirelessly transmitted to a receiver in a second system. In this manner, the receiver can demodulate the carrier wave to identify the data embedded in the carrier wave. For example, the receiver can correlate the oscillations to a binary value of '1' and the non-oscillations to a binary value of '0.' The string of binary values corresponds to the data embedded in the carrier signal.

The two-stage feedback generator includes active components (e.g. transistors) providing additional charge to the tank to maintain the generated oscillating signal. Using examples described herein, the feedback generator includes two loops. The first loop receives a first oscillating signal (e.g., an attenuated tank voltage) from a first node of the tank, amplifies the first oscillating signal using a two-stage amplifier, and feeds the amplified oscillating signal back to the first node of the tank via a coupling capacitor. The second loop takes an out-of-phase input (e.g., 180 degrees out of phase with the first oscillating input) from a second node of the tank, amplifies the out-of-phase input using a two-stage amplifier, and feeds the amplified out-of-phase input back to the second node of the tank via a coupling capacitor. The square waves that are fed back into the tank provide the additional charge needed to maintain the generated oscillating signal. As described herein, the carrier signal refers to the signal corresponding to a voltage differential between the first node and the second node of the tank.

In some examples, because the first loop and the second loop are decoupled, the first loop may oscillate at the same phase as the second loop. If the first and second loops provide charge at the same phase (e.g., common mode oscillation), the generated oscillation signal will distort. Examples described herein alleviate common mode oscillation issues using inductor mutual coupling to cross couple the first loop and the second loop. Inductor mutual coupling pushes common mode oscillation to a very high frequency, which can easily be rejected (e.g., ignored) by circuits. Additionally, mutual inductance makes sure the first node of the first loop and the second node of the second loop are differential. In some examples, common mode oscillation is rejected using a differential amplifier. In such examples, the differential amplifier provides common mode rejection to insure that the first loop and the second loop are always oscillating 180 degrees out of phase and common mode oscillation is rejected.

FIG. 1 illustrates an example transmitter 100 to wirelessly transmitting data to an example receiver 102. The example transmitter 100 includes an example encoder, an example encoder data line 105, and an example oscillator 106. The example transmitter 100 transmits carrier waves (e.g., electromagnetic waves encoded with data) to the example receiver 102 via the example carrier wave path 107.

The example transmitter 100 is an electrical device structured to transmit an oscillating carrier wave to the example receiver 102. In some examples, the transmitter 100 is part of a first system and the receiver 102 is part of a second system. In some examples, the first system and the second system have a large ground voltage difference (e.g., 1000V). The example transmitter 100 may encode data into the oscillating carrier wave using a plurality of schemes. For example, the transmitter 100 may encode data into the oscillating carrier wave using phase shift keying, frequency shift keying, amplitude shift keying, on-off keying, and/or any other type of modulation and/or keying. Although the example transmitter 100 may key using any type of scheme, examples described herein will be described using on-off keying. On-off keying includes generating an oscillating signal for a duration of time to represent a first binary value (e.g., '1') and not oscillating for a duration of time to represent a second binary value (e.g., '0'). In this manner, the example receiver 102 can receive a carrier wave via the example carrier wave path 107 and extract the binary data based on the series of oscillations.

The example transmitter 100 includes the example encoder 104. The example encoder 104 is an electrical device that determines how to instruct the example oscillator 106 to properly encode data. In some examples, the encoder 104 receives instructions including data to be transmitter from another device and/or processor. For example, the encoder 104 may receive instructions to serially transmit a string of binary values. In such an example, the encoder 104 instructs the example oscillator 106 as to when to oscillate and when not to oscillate to properly transmit a carrier wave representative of the string of binary values. In some examples, the instructions include outputting a first voltage (e.g., 3V) to the example oscillator 106 to initiate oscillation and transmitting a second voltage (e.g., 0V) to the example oscillator 106 to stop oscillation. The example encoder 104 transmits the instructions via the example encoder line 105.

The example oscillator 106 receives the instructions from the example encoder 104 and oscillates or stops oscillating based on the instructions. As further described below, the example oscillator 106 is a high swing oscillator capable of outputting a high swing oscillation beyond reliability limits associated with driving circuits within the oscillator 106. Although the example oscillator 106 generates an on-off keying carrier wave, the example oscillator 106 may generate any type of carrier wave (e.g., phase keyed, amplitude keyed, frequency keyed, etc.). As further described below, the example oscillator 106 includes a tank to generate an oscillating signal. In some examples, the tank is inductively, capacitively, and/or optically coupled to the example receiver 102 via the example carrier path 107. Alternatively, the tank may be coupled or otherwise connected to an antenna to transmit the generated oscillating signal to the example receiver 102 via the example carrier path 107.

Figure 2:
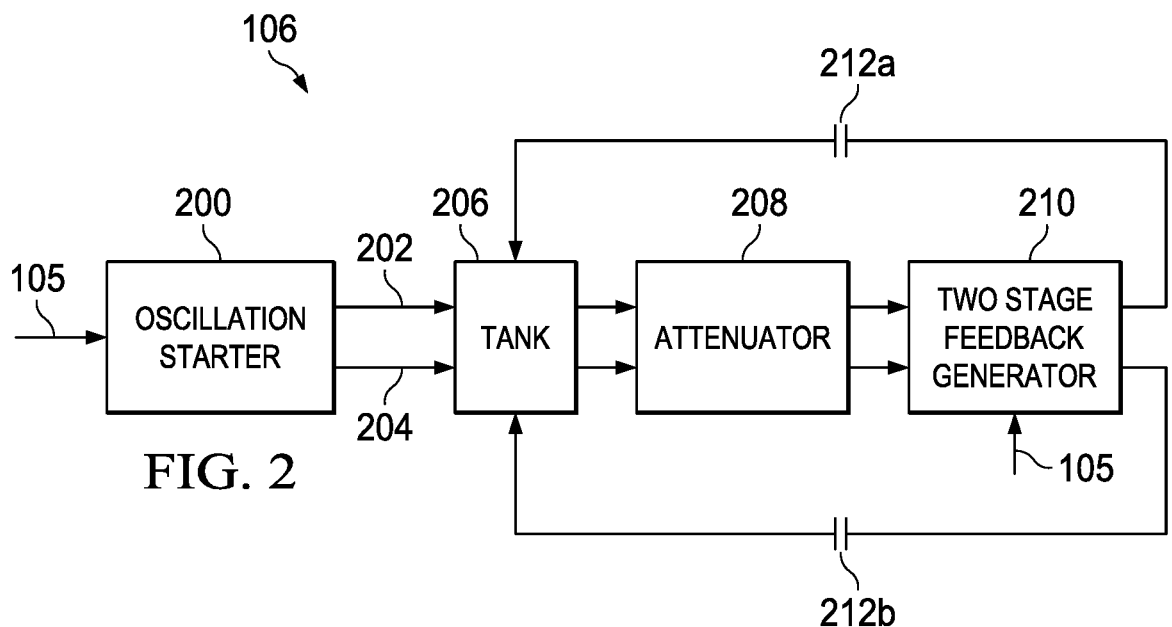
FIG. 2 is a block diagram of the example oscillator of FIG. 1.

FIG. 2 is a block diagram of the example oscillator 106 of FIG. 1. The example oscillator 106 receives instructions from the example encoder 104 via the example encoder line 105 of FIG. 1. The example oscillator 106 includes an example oscillation starter 200, an example enable line 202, an example complementary enable line 204, an example tank 206, an example two-stage feedback generator 210, and example coupling capacitors 212a-b.

The example oscillation starter 200 receives the instructions from the example encoder 104 via the example encoder line 105. In response to receiving the instructions, the example oscillation starter 200 outputs an enable voltage (e.g., signal) on the example enable line 202 and a complementary enable voltage (e.g., opposite of the enable voltage) on the example complementary enable line 204. For example, if the example oscillation starter 200 receives instructions to oscillate, the example oscillator starter 200 will output a high voltage (e.g., 1.8V) on the example enable line 202 and a low voltage (e.g., 0V) on the example complementary enable line 204. If the example oscillation starter 200 receives instructions not to oscillate, the example oscillator starter 200 will output a low voltage (e.g., 0V) on the example enable line 202 and a high voltage (e.g., 1.8V) on the example complementary enable line 204. The example oscillation starter 200 is a circuit that may include any number of semiconducting devices (e.g., transistors, capacitors, resistors, drivers, processors, logic gates, etc.). In some examples (e.g., always on oscillators), the oscillation starter 200 may be removed completely, and the example encoder line 105 may be used to provide the initial charge to initiate oscillations of the example tank 206.

The example tank 206 is circuit that generates an oscillating signal. As further described in FIG. 3, the tank 206 includes a differential inductor coupled to one or more capacitors. When current flows in a first direction, the inductors store energy based on the current in a magnetic field and the capacitor stores energy in an electric field. As the magnetic field builds up, the voltage stored in the capacitor discharges in a second direction. Thus, the inductors store energy based on the magnetic field in the opposite direction. This pattern continues to produce current and voltage that oscillates in the two opposite directions based on the charging and discharging of the capacitor. As previously described, the example tank 206 may be inductively, capacitively, and/or optically coupled to the example receiver 102 of FIG. 1. Alternatively, the example tank 206 may be coupled to an antenna to transmit the oscillating signal to the example receiver 102. The example tank 206 is further described in conjunction with FIGS. 3 and 5.

The example attenuator 208 is a circuit structure designed to break the voltage swing in the example tank 206 into two smaller voltages. In this manner, the example two-stage feedback generator 210 will see a voltage swing substantially equivalent to half of the voltage swing of the example tank 206. The example attenuator 208 allows the example tank 206 to include a high swing while protecting active components in the example two-stage feedback generator 210. The example attenuator 208 includes capacitors to break the voltage swing into smaller voltages, as further described in conjunction with FIG. 3.

The example two-stage feedback generator 210 is an active circuit that generates a feedback loop to amplify the oscillating signal associated with the example attenuator 208 and feedback an inverted with a phase corresponding to the oscillating signal. The example two-stage feedback generator 210 sustains the oscillations generated by the example tank 206 without additional pulses from the example oscillation starter 200 to provide additional energy. The example two-stage feedback generator 210 is further described in conjunction with FIGS. 3 and 5.

The example coupling capacitors 212a-b isolate the active circuits (the example two-stage feedback generator 210) from the example tank 206. The example two-stage feedback generator 210 (e.g., including active components) receives attenuated (e.g., reduced) swing at the example tank 206. Because the attenuated swing is received by active devices, the example tank 206 may output a much higher voltage swing that will not cause the risk of reaching the reliability limits of the active components of the two-stage feedback generator 210. For example, when a transistor is coupled directly to the example tank 206 (e.g., without the example coupling capacitors 212a-b), the voltage swing is limited by the breakdown voltage requirements of the transistor. Operating at a voltage higher than such requirements would necessarily damage the active circuitry. As illustrated in the example oscillator 106, the example tank 206 is isolated from the active circuitry through the use of the example attenuator 208 to operate at a high swing (e.g., much higher than ±Vdd, the supply voltage) without risk of damaging the active circuity of the example oscillation starter 200 and/or the example two-stage feedback generator 210, as further described in conjunction with FIG. 4B. In some examples, the coupling capacitors 212a-b are included in the example attenuator 208.

Figure 3:
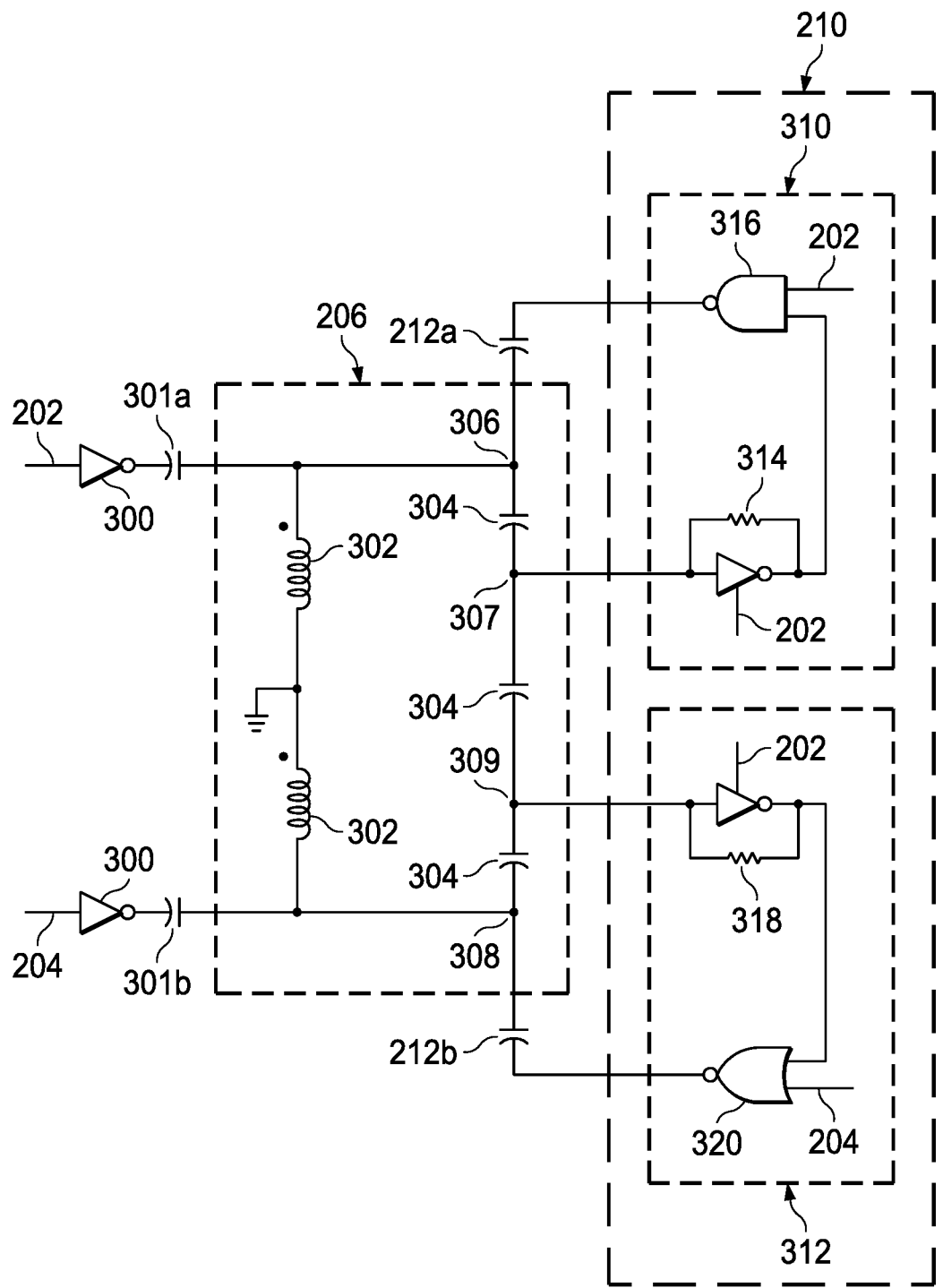
FIG. 3 is a circuit structure of an example tank and an example two-stage feedback generator of FIG. 2.

FIG. 3 is a circuit structure illustrating the example tank 206 and the example two-stage feedback generator 210 of FIG. 2. The example illustration includes the example enable line 202, the example complementary enable line 204, and the example coupling capacitors 212a-b of FIG. 2. The circuit of FIG. 3 further includes example NOT gates 300 and example coupling capacitors 301a-b. The example tank 206 includes example differential inductor whose two halves are represented by example differential inductor halves 302, example tank capacitor 304, and example nodes 306, 307, 308, 309. The example two-stage feedback generator 210 includes a first example loop 310, a second example loop 312, a first example sine-to-square wave converter 314, an example not and (NAND) gate 316, a second example sine-to-square wave converter 318, and an example not or (NOR) gate 320.

The example NOT gates 300 receive the enable and complementary enable voltage and invert the voltages. For example, if one of the example NOT gates 300 receives a high voltage (e.g., 1.8V), the example NOT gate 300 will output a low voltage (e.g., 0V). Additionally, if one of the example NOT gates 300 receives a low voltage (e.g., 0V), the example NOT gate 300 will output a high voltage (e.g., 0V). The output voltages of the example NOT gates 300 are transmitted to the example tank 206 via the example coupling capacitors 301a-b. A rising edge of the inverted voltages provides energy for the example tank 206 to initiate oscillation. In some examples, such as always on oscillators, the example NOT gates 300 and/or coupling capacitors 301a-b may be removed altogether.

The example tank inductors 302 (e.g., a differential inductor) are mutually coupled. As previously described above, mutually coupled inductors push common mode oscillation to very high frequencies. High frequency common mode oscillation may easily be rejected by circuits. The example tank capacitors 304 form the example attenuator 208 of FIG. 2 to provide protection against active components of the example two-stage feedback generator 210 to prevent reliability issues of the active components.

The example tank inductors 302 and the example tank capacitor 304 are passive electrical components that are coupled together to create an oscillating signal when triggered by a charge. The example tank inductors 302 resist changes in electric current passing through it. Initially, the example tank capacitors 304 stores a voltage associated with current in a first polarity based on receiving a charge associated with a rise in the enable voltage on the example enable line 202. As previously described above, the example tank inductors 302 build a magnetic field when current flows through it in a first direction reducing the voltage stored in the example capacitor 304. After the capacitor 304 is fully discharged, the current will continue to flow through the example tank inductors 302 reducing the magnetic field of the example tank inductors 302 and the capacitor 304 starts charging in the opposite direction. When the magnetic energy becomes zero, the capacitor 304 will store the charge in a second polarity opposite of the first polarity. The process continues to oscillate current (and voltage) in a first direction and then a second direction until internal parasitic resistance diminishes the oscillations. The example two-stage feedback generator 210 amplifies the oscillation and feeds the amplified oscillations back into the example tank to prevent the oscillations from diminishing while the example oscillator 106 is enabled. Additionally, the example tank capacitors 304 (e.g., the example attenuator 208) isolate active components of the example two-stage feedback generator 210 to prevent reliability issues of the active components.

The example tank 206 includes the first example node 306, the first example attenuated node 307, the second example node 308, and the second example attenuated node 309. The voltage at the first example node 306 is 180 degrees out of phase with the voltage at the second example node 308. Thus, the voltage at the first example node 306 is opposite the voltage at the second example node 308. For example, if the voltage of the first example node 306 is 2.1V, the voltage at the second example node 308 is around −2.1V. The voltage difference between the first example node 306 and the second example node 308 (e.g., across the example tank capacitors 304) is herein referred to as the tank voltage. The tank voltage representing the carrier wave (e.g., signal)

that is transmitted to the example receiver 102 of FIG. 1. The swing of the tank voltage is equivalent the difference between the first example node 306 and the second example node 308, as further described in conjunction with FIGS. 4A-B. The first and second example attenuated nodes 307, 309 each include half of the voltage swing. In this manner, the example voltages seen by the active components of the example two-stage feedback generator 210 is substantially half of the voltage swing across in the example tank 206.

The first example loop 310 receives the voltage at the first example attenuated node 307 which is coupled to the attenuated swing of node 306 and amplifies the voltage to maintain the oscillations of the example tank 206. The first loop 310 includes the first example sine-to-square wave converter 314 to convert the oscillating signal at the first example attenuated node 307 into a square wave. For example, when the oscillating signal at the first example node 306 is positive, the first example since-to-square wave converter 314 outputs a high voltage (e.g., Vdd). Additionally, when the oscillating signal at the first example node 306 is negative, the first example sine-to-square wave converter 314 outputs a low voltage (e.g., 0V). The first example sine-to-square wave converter 314 includes an enable input to enable and/or disable the first example sine-to-square wave converter 314. In the illustrated example, the example enable line 202 transmitted to the enable input of the first example sine-to-square wave converter 314. In this manner, the first example sine-to-square wave converter 314 outputs a square wave corresponding to the oscillating voltage at the first example node 306 when the enable voltage is high.

The first example loop 310 includes an example NAND gate 316 (e.g. a logic gate). The example NAND gate 316 includes active components to perform a NAND operation based on two inputs. In the illustrated example, the NAND gate 316 receives the square wave output by the first example sine-to-square wave converter 314 and the example enable voltage from the example enable line 202. The example NAND gate 316 outputs a low voltage (e.g., 0V) when the two inputs are both high. When the two inputs are both low voltages or when one input is a high voltage and the other is a low voltage, the example NAND gate 316 outputs a high voltage (e.g., Vdd). Thus, when the example enable line 202 is high, the example NAND gate 316 acts as an inverter. As further described in conjunction with FIG. 6, the example NAND gate 316 may be replaced with a NOT gate. The output of the example NAND gate 316 is fed back to the first example node 306 via the coupling capacitor 212a. Thus, when the NAND gate 316 includes a rising edge (e.g., the example NAND gate 316 changes from a low voltage to a high voltage), voltage is stored in the example coupling capacitor 212a and discharged into the example tank 206 to provide more charge to maintain an oscillation. The energy is imparted to the example tank 206 in the other direction when the output of the example NAND gate 316 goes from a high voltage to a low voltage. Thus, both edges associated with the output of the NAND gate 316 impart energy to the example tank 206 in different direction periodically.

The second example loop 312 receives the voltage at the second example attenuated node 309 which is coupled to the second example attenuated node 308 and amplifies the voltage to maintain the oscillations of the example tank 206. The second loop 312 includes the second example sine-to-square wave converter 318 to convert the oscillating signal at the second example node 308 into a square wave. For example, when the oscillating signal at the second example node 308 is positive, the second example since-to-square wave converter 318 outputs a high voltage (e.g., Vdd). Additionally, when the oscillating signal at the second example node 308 is negative, the second example sine-to-square wave converter 318 outputs a low voltage (e.g., 0V). The second example sine-to-square wave converter 318 includes an enable input to enable and/or disable the second example sine-to-square wave converter 318. In the illustrated example, the example enable line 202 transmitted to the enable input of the second example sine-to-square wave converter 318. In this manner, the second example sine-to-square wave converter 318 outputs a square wave corresponding to the oscillating voltage at the second example node 308 when the enable voltage is high.

The second example loop 312 includes an example NOR gate 320 (e.g., a logic gate). The example NOR gate 320 includes active components to perform a NOR operation based on two inputs. In the illustrated example, the NOR gate 320 receives the square wave output by the second example sine-to-square wave converter 318 and the example complementary enable voltage from the example complementary enable line 204. The example NOR gate 320 outputs a high voltage (e.g., Vdd) when the two inputs are both low. When the two inputs are both high voltages or when one input is a high voltage and the other is a low voltage, the example NOR gate 320 outputs a low voltage (e.g., 0V). Thus, when the example enable is high (e.g., the example complementary enable voltage is low), the example NOR gate 320 acts as an inverter. As further described in conjunction with FIG. 6, the example NOT gate 320 may be replaced with a NOT gate. The output of the example NOR gate 320 is fed back to the second example node 308 via the coupling capacitor 212b. Thus, when the NOR gate 320 includes a rising edge (e.g., the example NOR gate 320 changes from a low voltage to a high voltage), voltage is stored in the example coupling capacitor 212b and discharged into the example tank 206 to provide more charge to maintain an oscillation. Energy is imparted to the example tank 206 in the other direction when the output of the example NOR gate 320 goes from a high voltage to a low voltage. Thus, both edges associated with the output of the NOR gate 320 impart energy to the example tank 206 in different direction periodically. When the example NOR gate 320 goes from a high voltage to a low voltage, the example NAND gate 316 foes from a low voltage to a high voltage. In this manner, the differential energy is imparted to the example tank 206 periodically with the tank frequency itself.

The example oscillation starter 200 and the example two-stage feedback generator 210 include active circuitry including transistors to maintain oscillation. As described above, the swing associated with the voltage across the example tank capacitor 304 is no longer limited by the breakdown voltages of the active components of the example oscillation starter 200 and/or the example two-stage feedback generator 210 because the example tank 206 is isolated from the active components through the coupling capacitors 212a-b forming the example attenuator 208 of FIG. 2. Thus, the example tank 206 can oscillate using a higher swing (e.g., greater than ±Vdd) without the risk of damaging the active components.

In operation, the example oscillation starter 200 of FIG. 2 triggers an oscillation by increasing the enable voltage on the example enable line 202 from a low voltage (e.g., 0V) to a high voltage (e.g., 1.8 V). Additionally, the example oscillation starter 200 decreases the complementary enable voltage from the high voltage to the low voltage to compliment the enable voltage. The example enable voltage line 202 triggers the first and second sine-to-square wave converters 314, 318 to activate. Additionally, the example NOT gates 300 invert the enable and complementary enable voltages.

When the enable voltage goes high, the example coupling capacitor 301a receives a falling edge to produce a negative voltage pulse and the example coupling capacitor 301b receives a raising edge to produce a positive voltage pulse. The pulses provide enough energy to initialize oscillation in the example tank 206. As described above, the example tank inductors 302 and the example capacitor 304 work together to charge and discharge energy to produce an oscillating voltage between the first example node 306 and the second example node 308. As previously described above, the voltage at the first example node 306 is opposite the second example node 308 (e.g., the first node voltage 180 degrees out of phase with the second node voltage).

The voltage at the first example node 306 is attenuated by the example tank capacitor 304 (e.g., forming the example attenuator 208 of FIG. 2) and received by the first example sine-to-square wave converter 314 of the first example loop 310 and the voltage at the second example node 308 is attenuated by the example capacitor 304 and is received by the example is received by the second example sine-to-square wave converter 318 of the second example loop 312. When the voltage at the first example node 306 is positive (e.g., the voltage at the second example node 308 is negative), the output of the first example sine-to-square wave converter 314 of the first example loop 310 is a high voltage (e.g., Vdd) and the output of the second example sine-to-square wave converter 318 of the second example loop 312 is a low voltage (e.g., 0V). The high voltage output by the first example sine-to-square wave converter 314 transmitted to the example NAND gate 316 and the low voltage output by the second example sine-to-square wave converter 318 is transmitted to the example NOR gate 320.

Because the example NAND gate 316 receives two high voltages (e.g., the output of the first example sine-to-square wave converter 314 and the high voltage on the example enable line 202), the example NAND gate 316 outputs a low voltage (e.g., 0V). Additionally, because the example NOR gate 320 receives two low voltages (e.g., the output of the second example sine-to-square wave converter 318 and the low voltage on the example complementary enable line 204), the example NOR gate 320 outputs a high voltage (e.g., Vdd). The positive transition of the example NAND gate 316 (e.g., from a high voltage to a low voltage) is fed back to the first example node 306 through the example coupling capacitor 212a and the output of the example NOR gate 320 (e.g., from a low voltage to a high voltage) is fed back to the second example node 308 through the example coupling capacitor 212b.

When the voltage at the first example node 306 becomes negative (e.g., and the voltage at the second example node 308 becomes positive), the outputs of the example NAND gate 316 and the example NOR gate 320 will inverse. For example, the output of the example NAND gate 316 will change to the high voltage and the output of the example NOR gate 320 will change to the low voltage. The rising edge associated with the output change of the example NAND gate 316 will cause a voltage pulse through the example coupling capacitor 212a to provide additional charge to maintain the oscillating signal generated by the example tank 206. Additionally, the falling edge associated with the output change of the example NOR gate 320 will cause a negative voltage pulse through the example coupling capacitor 212b to provide additional charge to maintain the oscillating signal generated by the example tank 206. Because the example nodes 306, 308 oscillate between negative and positive voltages, the example NAND gate 316 and the example NOR gate 320 will continue to provide rising/falling edges to the example coupling capacitors 212a, 212b to provide continuous energy for the example tank 206 to maintain its oscillation.

When the example encoder 104 of FIG. 1 transmits instructions to cease oscillation, the example encoder 104 will instruct the example oscillation starter 200 to output a low voltage (e.g., 0V) on the example enable line 202. As described above, outputting a low voltage on the example enable line 202 disables the example sine-to-square wave converters 314, 318. Thus, the example two-stage feedback generator 210 will no longer provide feedback (e.g., charge) to the example tank 206, and the example tank 206 will stop oscillation.

Figure 4A:
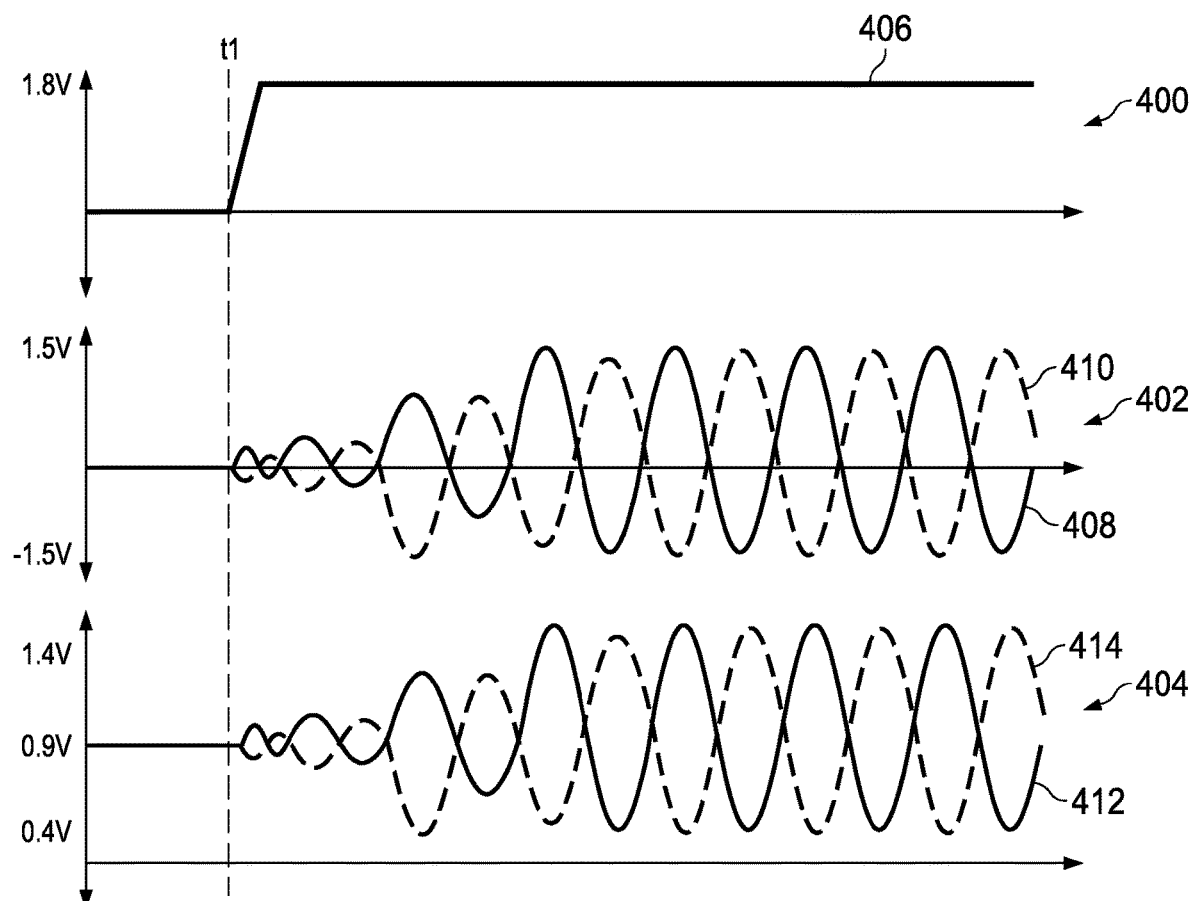
FIGS. 4A-B are timing diagrams illustrating a response to an example enable voltage at across an example tank capacitor of FIG. 3.
Figure 4B:
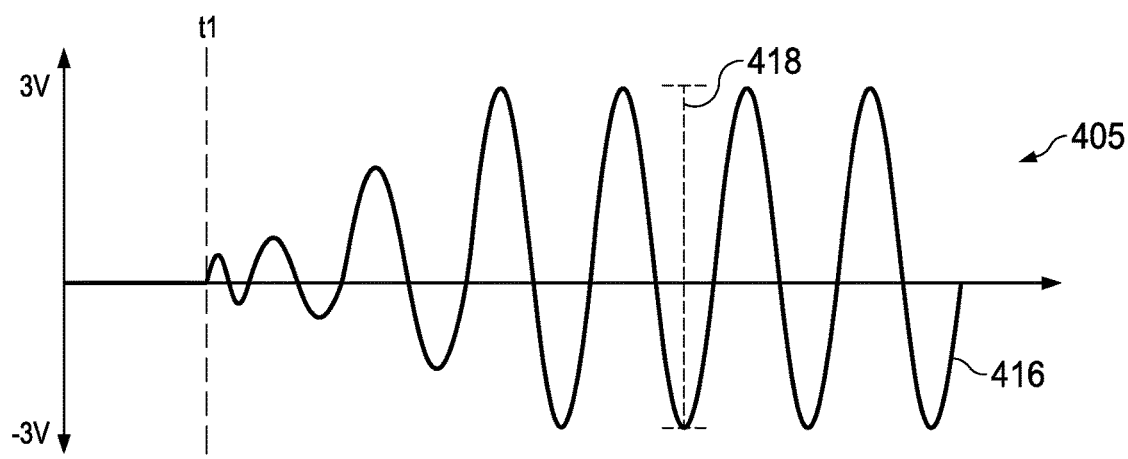

FIGS. 4A-4B illustrates voltages associated with the example tank 206 of FIG. 3 in response to rising edge of an enable voltage on the example enable line 202. FIGS. 4A-B includes an example enable voltage graph 400, an example node voltage graph 402, an example attenuated node voltage graph 404, and an example tank voltage graph 404. The example enable voltage graph 400 includes the example enable voltage 406 on the example enable line 202 of FIGS. 2 and 3. The example node voltage graph 402 includes a first example node voltage 408 at the first example node 306, a second example node voltage 410 at the second example node 308 of FIG. 3. The example attenuated node voltage graph 404 includes a first example attenuated node voltage 412 at the first example attenuation node 307, a second example attenuated node voltage 414 at the second example attenuation node 309 of FIG. 3. The example tank voltage graph 405 includes the example tank voltage 416 and the example voltage swing 418.

At time t1, the enable voltage on the example enable voltage 406 increases from a low voltage (e.g., 0V) to a high voltage (e.g., 1.8V), as shown in the enable voltage graph 400. As previously described in conjunction with FIG. 3, the rising edge of the enable voltage provides enough charge to the example tank 206 to initiate oscillation. As shown in the example node voltage graph 402, the first example node voltage 408 and the second example node voltage 410 begin to oscillate 180 degrees out of phase in response to the rising edge of the example enable voltage 406.

As shown in the example node voltage graph 404, the first example attenuated node voltage 412 and the second example attenuated node voltage 414 begin to oscillate 180 degrees out of phase in response to the rising edge of the example enable voltage 406 from a low voltage (0.4V) to a high voltage (1.4V). In this manner, the active components of the example two stage feedback generator 210 do not see a voltage higher than 1.4 V.

The example tank voltage 416 in the example tank voltage graph 405 corresponds to a voltage between the voltage at the first example node 306 and the voltage at the second example node voltage 308. As previously described in conjunction with FIG. 3, the voltage across the first example node 306 and the second example node 308 is an oscillating signal corresponding to a carrier wave that is transmitted to the example receiver 102 of FIG. 1. Because the example tank voltage 416 represents the difference between the first node voltage 408 and the second node voltage 410, the example tank voltage 416 oscillates at the same phase as the first example node voltage 408 with twice the amplitude. For example, once settled, the amplitude of the first example node voltage 408 is around 1.5 V and the amplitude of the example tank voltage 416 is around 3V. Thus, the example swing 418 of the example tank voltage 416 is around 6V. Even though the example swing 6V is higher than Vdd (e.g., 1.8V creating a differential swing higher than 3.6V or two times higher than the normal LC oscillator swing), the example coupling capacitors 212a-b, 301a-b and/or the example tank capacitors 304 protect the active components (e.g., transistors) in the example two-stage feedback generator 210 and/or the example oscillation starter 200 by isolating the active components and creating attenuated nodes (e.g., the example attenuated nodes 307, 309), as previously described in FIG. 3. In this manner, a high swing will not cause damage relating to providing voltage above the breakdown voltage of the active components.

Figure 5:
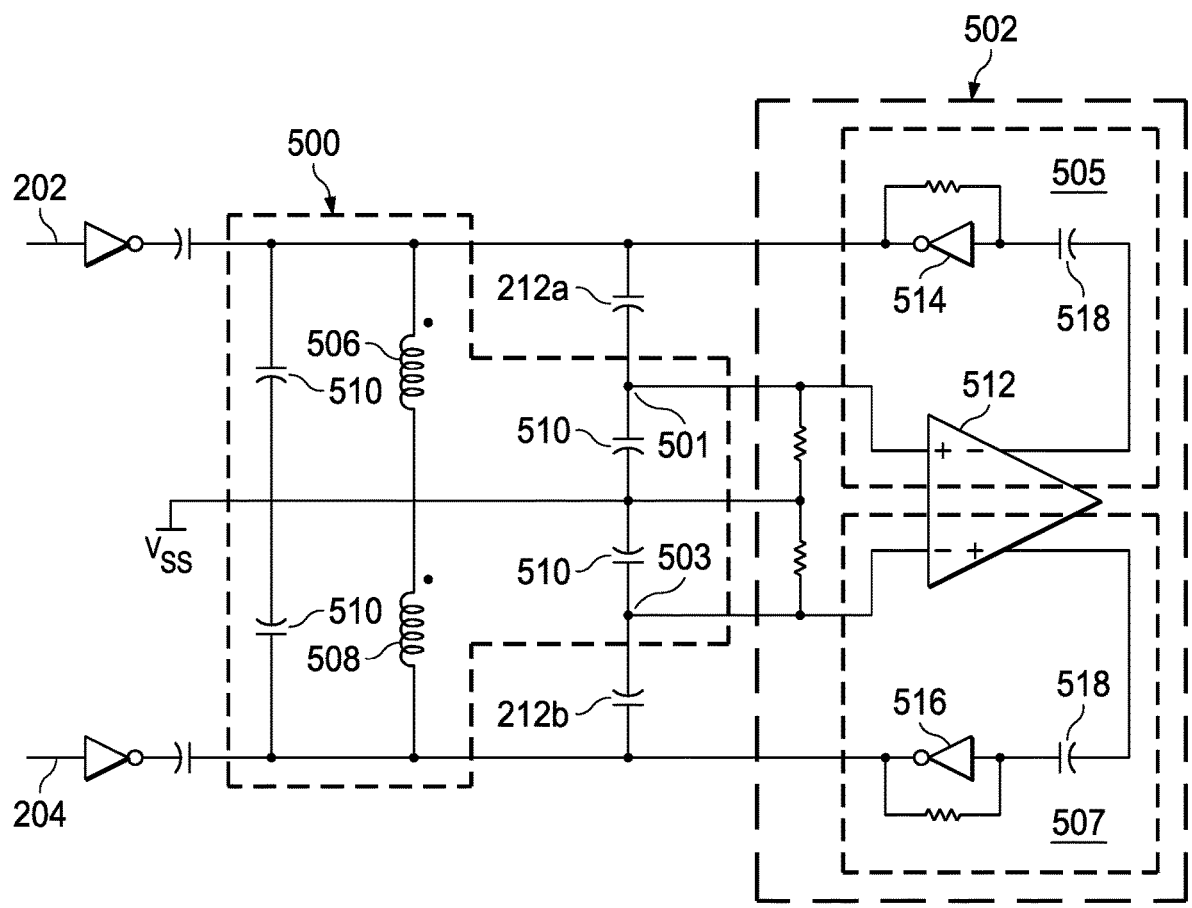
FIG. 5 is a circuit structure of an alternative example tank and an alternative example two-stage feedback generator that may be implemented in the example oscillator of FIG. 2.

FIG. 5 is a circuit structure illustrating an example tank 500 and an example two-stage feedback generator 502 that may be alternatively implemented in FIG. 2, when it may not be possible to mutually couple example inductors 506, 508. The alternative circuit structure includes the example enable line 202, the example complementary enable line 204, and the example coupling capacitors 212a-b of FIG. 2. The example tank 500 includes the example inductors 506, 508 and example tank capacitors 510. The example two-stage feedback generator 502 includes a first example loop 505, a second example loop 507, a first example gain stage 512, second example gain stages 514, 516, and coupling capacitors 518.

The example tank 500 works similarly to the example tank 206 of FIG. 3; however, the example inductors 506, 508 are not mutually coupled. Because the example inductors 506, 508 are not mutually coupled, the example first gain stage 512 (e.g., a fully differential amplifier) is utilized to provide common mode rejection, as further described below. In the illustrated example tank 500, the tank voltage is the voltage differential between the first example node 501 and the second example node 503. As previously described in conjunction with FIG. 3, when the example enable voltage on the example enable line 202 goes high, the rising edge of the provides enough energy to initiate generation of an oscillating signal in the example tank 500.

The example two-stage feedback generator 502 receives the initial generated oscillations of the example tank 500 and provides additional charge to the example tank 500 to maintain a high swing oscillation. The example first gain stage 512 receives the voltage at the first example node 501 and the voltage at the second example node 503 and inverts and amplifies both received signals in the first example loop 505 and the second example loop 507 respectively. Additionally, the example fully differential amplifier includes a common mode rejection to ensure that the example tank 500 is always outputting a differential oscillation and the common mode oscillation is rejected.

The example second gain stages 514, 516 receive the outputs of the example first gain stage 512 via the example coupling capacitors 518 and output a second amplified signal. In some examples, the example second gain stages 514, 516 are sine-to-square wave converters. In such examples, when the sine wave associated with the output of the example first gain stage 512 is positive, the example second gain stages 514, 516 output a high voltage (e.g., Vdd). Additionally, when the sine wave associated with the output of the example first gain stage 512 is negative, the example second gain stages 514, 516 output a low voltage (e.g., 0V).

In operation, when the voltage at the first example node 501 is a positive voltage, the example first gain stage 512 will transmit the voltage as a negative amplified voltage to the first example second gain stage 514. At the same time, the voltage at the second example node 503 (which is opposite the voltage at the first example node 501) will be a negative voltage. Thus, the example first gain stage 512 will transmit the voltage as a positive amplified voltage to the second example second gain stage 516. In this manner, the first example second gain stage 514 will output a low voltage (e.g., 0V) and the second example second gain stage 516 will output a high voltage (e.g., Vdd). Consequentially, when the voltage at the nodes flip (e.g., from positive to negative or from negative to positive), the outputs of the example second gain stages 514, 516 will necessarily flip as well. Thus, the first example second gain stage 514 will provide additional voltage (e.g., charge) to the example tank 500 to maintain a high swing oscillation. As previously described, the example coupling capacitors 212a-b, and the example tank capacitors 510 (e.g., forming the example attenuator 208 of FIG. 2) isolate the high swing voltage (e.g., the voltage differential between the first example node 501 and the second example node 503) from the active components of the example oscillation starter 200 of FIG. 2 and/or the example two-stage feedback generator 502 preventing the risk of damage corresponding to operating such active components above the breakdown voltage of the active components.

Figure 6:
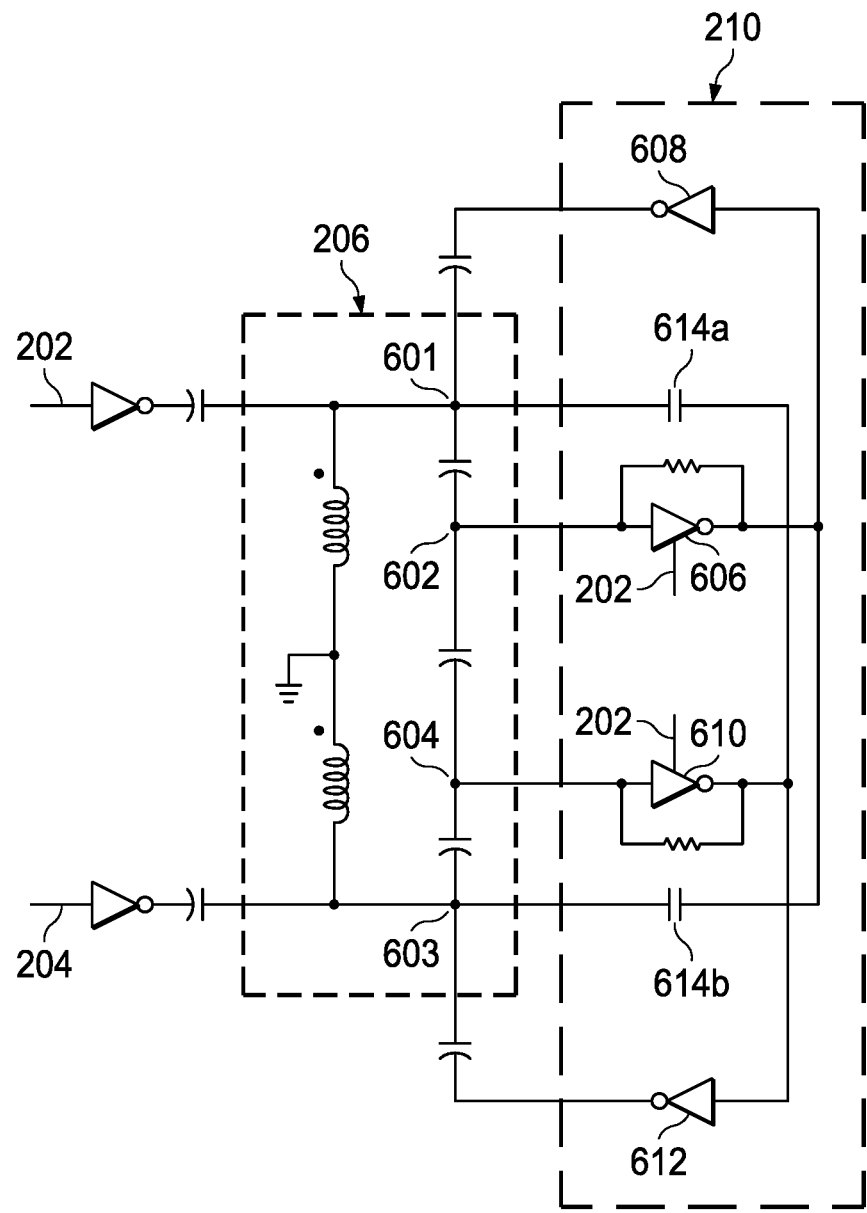
FIG. 6 is a circuit structure of an alternative example tank and an alternative example two-stage feedback generator that may be implemented in the example oscillator of FIG. 2.

FIG. 6 is a circuit structure illustrating the example tank 206 and the example two-stage feedback generator 210 that may be alternatively implemented in FIG. 2 to provide an additional boost to the example tank 206. The alternative circuit structure includes the example enable line 202, the example complementary enable line 204, the example tank 206, and the example two-stage feedback generator 210 of FIG. 2. The example tank 206 includes the example nodes 601, 602, 603, 604. The example two-stage feedback generator 210 includes a first example sine-to-square wave converter 606, a first example NOT gate 608, a second example sine-to-square wave converter 610, a second example NOT gate 612, and cross coupling capacitors 614a-b.

The example circuit of FIG. 6 differs from the example circuit of FIG. 3 in that the example two-stage feedback generator 210 includes the first and second example NOT gates 608, 612 (e.g., replacing the example NAND gate 316 and the example NOR gate 320 of FIG. 2). Alternatively, the example NOT gates 608 may be replaced with the example NAND gate 316 and the example NOT gate 612 may be replaced with the example NOR gate 320, as described above in conjunction with FIG. 3. Additionally, the example two-stage feedback generator 210 includes the example cross coupling capacitors 614a-b.

The first example cross coupling capacitor 614a receives the output of the second example sine-to-square wave converter 610 and the second example cross coupling capacitor 614b receives the output of the first example sine-to-square wave converter 606. The cross coupling capacitors 614a-b provide an additional energy boosts to the example tank 206. Because the example cross coupling capacitors 614a-b cross couple the two loops of the example two-stage feedback generator 210, the example coupling capacitors 614a-b provide phase correction to the example circuit of FIG. 6.

When the example tank 206 produces an oscillating voltage. The first attenuated voltage at the first example attenuated node 602 is received by the first example sine-to-square wave converter 606. The first example sine-to-square wave converter 606 provides a square wave representative of the first attenuated voltage to the second cross coupling capacitor 614b to provide energy to the second example node 603 of the example tank 206 based on a rising/falling edge. Additionally, the first example sine-to-square wave converter 606 provides the square wave to the first example NOT gate 608 which is inverted to provide inverted energy the first example node 601 of the example tank 206 based on a rising/falling edge. Similarly, the second attenuated voltage at the second example attenuated node 604 (e.g., 180 degrees out of phase with the first attenuated voltage) is received by the second example sine-to-square wave converter 610. The second example sine-to-square wave converter 610 provides a square wave representative of the second attenuated voltage (e.g., opposite the first attenuated voltage) to the first cross coupling capacitor 614a to provide energy (e.g., opposite the energy provided by the second coupling capacitor 614b) to the first example node 601 of the example tank 206 based on a rising/falling edge. Additionally, the second example sine-to-square wave converter 610 provides the square wave to the second example NOT gate 612 which is inverted to provide inverted energy (e.g., opposite the inverted energy provided by the first example NOT gate 608) to the second example node 603 of the example tank 206 based on a rising/falling edge. In this manner, the first and second example nodes 601, 603 receive twice the energies than the example circuit of FIG. 3 providing phase correction to the circuit.

From the foregoing, it would be appreciated that the above described methods, apparatus, and articles of manufacture generate an oscillating output voltage signal having a voltage swing greater than the breakdown voltage of active components in an oscillator. Using the examples described herein, a tank of an oscillator may output a swing voltage whose peak voltage is beyond the reliability limits of active components of the driving circuitry without damaging the driving circuitry. Examples described herein provide a differential swing across a tank that is 1.5-2 times higher than 2 times Vdd. Increasing the voltage swing of the tank can increase the power and signal-to-noise ratio in communication systems using an oscillator to generate a carrier wave. Additionally, since the oscillator may use channel elements, additional trim to fine tune the frequency of the oscillator may not be required. Further, examples described herein can start and stop the oscillator with a digital edge which synchronizes the oscillating signal (e.g. a carrier or clock) with data.

Example oscillators are described to generate an oscillating output signal having a voltage swing greater than a voltage swing across nodes of active devices. Such example oscillators include a tank to generate an oscillating output signal in response receiving an edge of an enable signal. Such example oscillators further include a feedback generator including a first loop forming a first feedback loop with the tank, the first feedback loop providing a first charge to maintain the oscillating output signal and a second loop forming a second feedback loop with the tank, the second feedback loop providing a second charge to maintain the oscillating output signal, the first and second charges combining with the oscillating output signal to generate a high voltage swing. Such oscillators include an attenuator connected between the tank and the feedback generator to isolate the tank from active components of the feedback generator.

In some example oscillators, a peak voltage of the high voltage swing is greater than a breakdown voltage of the active components in the feedback generator. Some example oscillators further include an oscillation starter to output the enable signal. In some example oscillators, the feedback generator is structured to provide the first charge at a first phase and a second phase at a second phase, the first phase and the second phase being 180 degrees out of phase with respect to each other. In some example oscillators, the tank ceases to generate the oscillating output signal in response to a lowering of the enable signal from a first voltage to a second voltage.

In some example oscillators, the oscillating output signal corresponds to a voltage differential between a first node voltage at a first node of the tank and a second node voltage at a second node of the tank. In some example oscillators, the first loop includes a sine-to-square wave converter to convert an oscillating voltage at the first node of the tank to a square wave. In some example oscillators, the sine-to-square wave converter amplifies the oscillating voltage. In some example oscillators, the first loop includes a logic gate to output a first voltage when the enable signal and the output of the sine-to-square wave converter are above a threshold. In some example oscillators, the attenuator includes coupling capacitors to isolate the first node from the sine-to-square wave converter and the logic gate.

In some example oscillators, the logic gate is structured to output a second voltage greater than the first voltage when at least one of the enable signal or the output of the sine-to-square wave converter are below the threshold. In some example oscillators, the first loop is structured to provide the first charge to the oscillating output signal by transmitting the output of the logic gate to the first node. In some example oscillators, the first loop is structured to provide a third charge to the oscillating output signal by transmitting the output of the sine-to-square wave converter to the second node via a coupling capacitor, the third charge providing phase correction to the tank.

In some example oscillators, the second loop includes a sine-to-square wave converter to convert an oscillating voltage at the second node of the tank to a square wave. In some example oscillators, the sine-to-square wave converter amplifies the oscillating voltage. In some example oscillators, the second loop includes a logic gate to output a first voltage when a complementary enable voltage and the output of the sine-to-square wave converter are below a threshold. In some example oscillators, the attenuator includes coupling capacitors to isolate the second node from the sine-to-square wave converter and the logic gate.

In some example oscillators, the logic gate is structured to output a second voltage lower than the first voltage when at least one of the complementary enable voltage or the output of the sine-to-square wave converter are above the threshold. In some example oscillators, the second loop is structured to provide the second charge to the oscillating output signal by transmitting the output of the logic gate to the second node. In some example oscillators, the second loop is structured to provide a third charge to the oscillating output signal by transmitting the output of the sine-to-square wave converter to the first node via a coupling capacitor, the third charge providing phase correction to the tank. In some example oscillators, the tank includes a first inductor and a second inductor coupled to the first inductor, the first inductor and the second inductor being mutually coupled. In some example oscillators, the oscillating output signal is a voltage difference at a first node connected to a first terminal of the first inductor and a second node connected to a terminal of the second inductor.

In some example oscillators, the feedback generator includes a fully differential amplifier to receive a first oscillating signal of a first node in the tank and a second oscillating signal of a second node in the tank, the first oscillating signal and the second oscillating signal oscillating 180 degrees out of phase with respect to each other. In such example oscillators, the fully differential amplifier is to output a third oscillating signal opposite the first oscillating signal, the third oscillating signal being amplified and output a fourth oscillating signal opposite the second oscillating signal, the fourth oscillating signal being amplified.

In some example oscillators, the first loop includes a first sine-to-square wave converter to convert the third oscillating signal into a first square wave and the second loop includes a second sine-to-square wave converter to convert the fourth oscillating signal into a second square wave, the first and second square waves providing charge to maintain the oscillating output signal.

Modifications are possible in the described embodiments, and other embodiments are possible, within the scope of the claims.

What is claimed is:

1. An oscillator comprising:
a tank including first and second passive electrical components coupled together and each having respective first and second terminals;
a feedback circuit including first and second loop circuits each having a respective input and output;
an attenuator coupled between the tank and the feedback circuit, the attenuator including first and second attenuator capacitors each having respective first and second terminals, wherein the first attenuator capacitor is coupled to the input of the first loop circuit, and the second attenuator capacitor is coupled to the input of the second loop circuit;
a first coupling capacitor having first and second terminals, wherein the first coupling capacitor is coupled to the output of the first loop circuit, the first attenuator capacitor, and the first terminal of the first passive electrical component; and
a second coupling capacitor having first and second terminals, wherein the second coupling capacitor is coupled to the output of the second loop circuit, the second attenuator capacitor, and the first terminal of the second passive electrical component.

2. The oscillator of claim 1, wherein:
the first and second passive electrical components are respectively first and second inductors;
the first terminal of the first inductor is coupled to the first coupling capacitor;
the second terminal of the first inductor is coupled to the second terminal of the second inductor; and
the first terminal of the second inductor is coupled to the second coupling capacitor.

3. The oscillator of claim 2, wherein the respective second terminals of first and second inductors are coupled together and adapted to couple to a common reference source.

4. The oscillator of claim 1, the first loop circuit including a first sine-to-square wave converter having a respective input and output, and the second loop circuit including a second sine-to-square wave converter having a respective input and output.

5. The oscillator of claim 4, the first sine-to-square wave converter including a first resistor and a first NOT gate coupled in parallel between the respective input and output of the first sine-to-square wave converter, and the second sine-to-square wave converter including a second resistor and a second NOT gate coupled in parallel between the respective input and output of the second sine-to-square wave converter.

6. The oscillator of claim 4, the attenuator further including a third attenuator capacitor having a respective first terminal coupled to the first terminal of the first attenuator capacitor and a respective second terminal coupled to the first terminal of the second attenuator capacitor, the first loop circuit further including a first logic gate coupled between the first sine-to-square wave converter and the first coupling capacitor, and the second loop circuit further including a second logic gate coupled between the second sine-to-square wave converter and the second coupling capacitor.

7. The oscillator of claim 6, wherein:
the first logic gate is a NOT AND (NAND) gate having a respective input coupled to the output of the first sine-to-square wave converter and a respective output forming the output of the first loop circuit;
the first terminal of the first coupling capacitor is coupled to the output of the NAND gate, and the second terminal of the first coupling capacitor is coupled to the first terminal of the first passive electrical component and the second terminal of the first attenuator capacitor;
the input of the first sine-to-square wave converter forms the input of the first loop circuit and is coupled to the first terminal of the first attenuator capacitor and the first terminal of the third attenuator capacitor;
the second logic gate is a NOT OR (NOR) gate having a respective input coupled to the output of the second sine-to-square wave converter and a respective output forming the output of the second loop circuit;
the first terminal of the second coupling capacitor is coupled to the output of the NOR gate, and the second terminal of the second coupling capacitor is coupled to the first terminal of the second passive electrical component and the second terminal of the second attenuator capacitor; and
the input of the second sine-to-square wave converter forms the input of the second loop circuit and is coupled to the first terminal of the second attenuator capacitor and the second terminal of the third attenuation capacitor.

8. The oscillator of claim 6, the first loop circuit further including a first loop capacitor having respective first and second terminals, the second loop circuit further including a second loop capacitor having respective first and second terminals, and wherein:
the first logic gate is a first NOT gate having a respective input coupled to the output of the first sine-to-square wave converter and the first terminal of the second loop capacitor, and the first NOT gate having a respective output forming the output of the first loop circuit;
the first terminal of the first coupling capacitor is coupled to the output of the first NOT gate, and the second terminal of the first coupling capacitor is coupled to the first terminal of the first passive electrical component, the second terminal of the first attenuator capacitor, and the first terminal of the first loop capacitor;
the input of the first sine-to-square wave converter forms the input of the first loop circuit and is coupled to the first terminal of the first attenuator capacitor and the first terminal of the third attenuator capacitor;
the second logic gate is a second NOT gate having a respective input coupled to the output of the second sine-to-square wave converter and the second terminal of the first loop capacitor, and the second NOT gate having a respective output forming the output of the second loop circuit;
the first terminal of the second coupling capacitor is coupled to the output of the second NOT gate, and the second terminal of the second coupling capacitor is coupled to the first terminal of the second passive electrical component, the second terminal of the second attenuator capacitor, and the second terminal of the second loop capacitor; and the input of the second sine-to-square wave converter forms the input of the second loop circuit and is coupled to the first terminal of the second attenuator capacitor and the second terminal of the third attenuation capacitor.

9. The oscillator of claim 4, the feedback circuit further including:
a gain stage having first and second inputs and first and second outputs;
a first loop capacitor coupled between the first output of the gain stage and the input of the first sine-to-square wave converter;
a second loop capacitor coupled between the second output of the gain stage and the input of the second sine-to-square wave converter; and
first and second resistors each having respective first and second terminals, the first and second resistors coupled between the first and second inputs of the gain stage.

10. The oscillator of claim 9, wherein the gain stage is a fully differential amplifier.

11. The oscillator of claim 9, wherein:
the output of the first sine-to-square wave converter forms the output of the first loop circuit and is coupled to the respective first terminals of the first coupling capacitor and first passive electrical component;
the first input of the gain stage forms the input of the first loop circuit and is coupled to the first terminal of the first resistor, the second terminal of the first coupling capacitor, and the first terminal of the first attenuator capacitor;
the output of the second sine-to-square wave converter forms the output of the second loop circuit and is coupled to the respective first terminals of the second coupling capacitor and second passive electrical component;
the second input of the gain stage forms the input of the second loop circuit and is coupled to the first terminal of the second resistor, the second terminal of the second coupling capacitor, and the first terminal of the second attenuator capacitor; and
the respective second terminals of the first and second resistors are coupled together and to the respective second terminals of the first and second attenuator capacitors.

12. The oscillator of claim 1, further comprising:
an oscillation starter having first and second outputs;
a first NOT gate having a first logic input coupled to the first output of the oscillation starter, and the first NOT gate having a first logic output;
a third coupling capacitor coupled between the first logic output and the first terminal of the first passive electrical component;
a second NOT gate having a second logic input coupled to the second output of the oscillation starter, and the second NOT gate having a second logic output;
a fourth coupling capacitor coupled between the second logic output and the first terminal of the second passive electrical component.

13. An oscillator comprising:
a tank including first and second inductors coupled together and each having respective first and second terminals;
a feedback circuit including first and second loop circuits each having a respective input and output;

an attenuator coupled between the tank and the feedback circuit, the attenuator including first and second attenuator capacitors each having respective first and second terminals, wherein the first attenuator capacitor is coupled to the input of the first loop circuit, and the second attenuator capacitor is coupled to the input of the second loop circuit;
a first coupling capacitor having respective first and second terminals, wherein the first coupling capacitor is coupled to the output of the first loop circuit, the first attenuator capacitor, and the first terminal of the first inductor; and
a second coupling capacitor having respective first and second terminals, wherein the second coupling capacitor is coupled to the output of the second loop circuit, the second attenuator capacitor, and the first terminal of the second inductor.

14. The oscillator of claim 13, the first loop circuit including:
a first sine-to-square wave converter having a respective input and output; and
a first logic gate coupled between the first sine-to-square wave converter and the first coupling capacitor;
the second loop circuit including:
a second sine-to-square wave converter having a respective input and output; and
a second logic gate coupled between the second sine-to-square wave converter and the second coupling capacitor; and
the attenuator further including a third attenuator capacitor having a respective first terminal coupled to the first terminal of the first attenuator capacitor and a respective second terminal coupled to the first terminal of the second attenuator capacitor.

15. The oscillator of claim 14, the first sine-to-square wave converter including a first resistor and a first NOT gate coupled in parallel between the respective input and output of the first sine-to-square wave converter, and the second sine-to-square wave converter including a second resistor and a second NOT gate coupled in parallel between the respective input and output of the second sine-to-square wave converter.

16. The oscillator of claim 14, wherein:
the first logic gate is a NOT AND (NAND) gate having a respective input coupled to the output of the first sine-to-square wave converter and a respective output forming the output of the first loop circuit;
the first terminal of the first coupling capacitor is coupled to the output of the NAND gate, and the second terminal of the first coupling capacitor is coupled to the first terminal of the first inductor and the second terminal of the first attenuator capacitor;
the input of the first sine-to-square wave converter forms the input of the first loop circuit and is coupled to the first terminal of the first attenuator capacitor and the first terminal of the third attenuator capacitor;
the second logic gate is a NOT OR (NOR) gate having a respective input coupled to the output of the second sine-to-square wave converter and a respective output forming the output of the second loop circuit;
the first terminal of the second coupling capacitor is coupled to the output of the NOR gate, and the second terminal of the second coupling capacitor is coupled to the first terminal of the second inductor and the second terminal of the second attenuator capacitor; and
the input of the second sine-to-square wave converter forms the input of the second loop circuit and is coupled to the first terminal of the second attenuator capacitor and the second terminal of the third attenuation capacitor.

17. The oscillator of claim 14, the first loop circuit further including a first loop capacitor having respective first and second terminals, the second loop circuit further including a second loop capacitor having respective first and second terminals, and wherein:
the first logic gate is a first NOT gate having a respective input coupled to the output of the first sine-to-square wave converter and the first terminal of the second loop capacitor, and the first NOT gate having a respective output forming the output of the first loop circuit;
the first terminal of the first coupling capacitor is coupled to the output of the first NOT gate, and the second terminal of the first coupling capacitor is coupled to the first terminal of the first inductor, the second terminal of the first attenuator capacitor, and the first terminal of the first loop capacitor;
the input of the first sine-to-square wave converter forms the input of the first loop circuit and is coupled to the first terminal of the first attenuator capacitor and the first terminal of the third attenuator capacitor;
the second logic gate is a second NOT gate having a respective input coupled to the output of the second sine-to-square wave converter and the second terminal of the first loop capacitor, and the second NOT gate having a respective output forming the output of the second loop circuit;
the first terminal of the second coupling capacitor is coupled to the output of the second NOT gate, and the second terminal of the second coupling capacitor is coupled to the first terminal of the second inductor, the second terminal of the second attenuator capacitor, and the second terminal of the second loop capacitor; and
the input of the second sine-to-square wave converter forms the input of the second loop circuit and is coupled to the first terminal of the second attenuator capacitor and the second terminal of the third attenuation capacitor.

18. The oscillator of claim 14, wherein the respective second terminals of first and second inductors are coupled together and adapted to couple to a common reference source.

19. The oscillator of claim 13, the feedback circuit further including:
a first gain stage having first and second inputs and first and second outputs;
second and third gain stages each having a respective input and output;
a first loop capacitor coupled between the first output of the first gain stage and the input of the second gain stage;
a second loop capacitor coupled between the second output of the first gain stage and the input of the third gain stage; and
first and second resistors each having respective first and second terminals, the first and second resistors coupled between the first and second inputs of the first gain stage.

20. The oscillator of claim 19, wherein the first gain stage is a fully differential amplifier, and the second and third gain stages are respectively first and second sine-to-square wave converters.

21. The oscillator of claim 20, the first sine-to-square wave converter including a first resistor and a first NOT gate coupled in parallel between the respective input and output of the first sine-to-square wave converter, and the second sine-to-square wave converter including a second resistor and a second NOT gate coupled in parallel between the respective input and output of the second sine-to-square wave converter.

22. The oscillator of claim 19, wherein:
the output of the second gain stage forms the output of the first loop circuit and is coupled to the respective first terminals of the first coupling capacitor and first inductor;
the first input of the first gain stage forms the input of the first loop circuit and is coupled to the first terminal of the first resistor, the second terminal of the first coupling capacitor, and the first terminal of the first attenuator capacitor;
the output of the third gain stage forms the output of the second loop circuit and is coupled to the respective first terminals of the second coupling capacitor and second inductor;
the second input of the first gain stage forms the input of the second loop circuit and is coupled to the first terminal of the second resistor, the second terminal of the second coupling capacitor, and the first terminal of the second attenuator capacitor; and
the respective second terminals of the first and second resistors are coupled together and to the respective second terminals of the first and second attenuator capacitors.

23. Apparatus comprising:
an encoder; and
an oscillator coupled to the encoder, the oscillator comprising:
a tank including first and second inductors coupled together and each having respective first and second terminals;
a feedback circuit including first and second loop circuits each having a respective input and output;
an attenuator coupled between the tank and the feedback circuit, the attenuator including first and second attenuator capacitors each having respective first and second terminals, wherein the first attenuator capacitor is coupled to the input of the first loop circuit, and the second attenuator capacitor is coupled to the input of the second loop circuit;
a first coupling capacitor having respective first and second terminals, wherein the first coupling capacitor is coupled to the output of the first loop circuit, the first attenuator capacitor, and the first terminal of the first inductor; and
a second coupling capacitor having respective first and second terminals, wherein the second coupling capacitor is coupled to the output of the second loop circuit, the second attenuator capacitor, and the first terminal of the second inductor.

24. The apparatus of claim 13, the first loop circuit including:
a first sine-to-square wave converter having a respective input and output; and
a first logic gate coupled between the first sine-to-square wave converter and the first coupling capacitor;
the second loop circuit including:
a second sine-to-square wave converter having a respective input and output; and
a second logic gate coupled between the second sine-to-square wave converter and the second coupling capacitor; and the attenuator further including a third attenuator capacitor having a respective first terminal coupled to the first terminal of the first attenuator capacitor and a respective second terminal coupled to the first terminal of the second attenuator capacitor.

25. The apparatus of claim 24, wherein:

the first logic gate is a NOT AND (NAND) gate having a respective input coupled to the output of the first sine-to-square wave converter and a respective output forming the output of the first loop circuit;

the first terminal of the first coupling capacitor is coupled to the output of the NAND gate, and the second terminal of the first coupling capacitor is coupled to the first terminal of the first inductor and the second terminal of the first attenuator capacitor;

the input of the first sine-to-square wave converter forms the input of the first loop circuit and is coupled to the first terminal of the first attenuator capacitor and the first terminal of the third attenuator capacitor;

the second logic gate is a NOT OR (NOR) gate having a respective input coupled to the output of the second sine-to-square wave converter and a respective output forming the output of the second loop circuit;

the first terminal of the second coupling capacitor is coupled to the output of the NOR gate, and the second terminal of the second coupling capacitor is coupled to the first terminal of the second inductor and the second terminal of the second attenuator capacitor; and the input of the second sine-to-square wave converter forms the input of the second loop circuit and is coupled to the first terminal of the second attenuator capacitor and the second terminal of the third attenuation capacitor.

26. The apparatus of claim 24, the first loop circuit further including a first loop capacitor having respective first and second terminals, the second loop circuit further including a second loop capacitor having respective first and second terminals, and wherein:

the first logic gate is a first NOT gate having a respective input coupled to the output of the first sine-to-square wave converter and the first terminal of the second loop capacitor, and the first NOT gate having a respective output forming the output of the first loop circuit;

the first terminal of the first coupling capacitor is coupled to the output of the first NOT gate, and the second terminal of the first coupling capacitor is coupled to the first terminal of the first inductor, the second terminal of the first attenuator capacitor, and the first terminal of the first loop capacitor;

the input of the first sine-to-square wave converter forms the input of the first loop circuit and is coupled to the first terminal of the first attenuator capacitor and the first terminal of the third attenuator capacitor;

the second logic gate is a second NOT gate having a respective input coupled to the output of the second sine-to-square wave converter and the second terminal of the first loop capacitor, and the second NOT gate having a respective output forming the output of the second loop circuit;

the first terminal of the second coupling capacitor is coupled to the output of the second NOT gate, and the second terminal of the second coupling capacitor is coupled to the first terminal of the second inductor, the second terminal of the second attenuator capacitor, and the second terminal of the second loop capacitor; and the input of the second sine-to-square wave converter forms the input of the second loop circuit and is coupled to the first terminal of the second attenuator capacitor and the second terminal of the third attenuation capacitor.

27. The apparatus of claim 23, the feedback circuit further including:

a fully differential amplifier having first and second inputs and first and second outputs;

first and second sine-to-square wave converters stages each having a respective input and output;

a first loop capacitor coupled between the first output of the fully differential amplifier and the input of the first sine-to-square wave converter;

a second loop capacitor coupled between the second output of the fully differential amplifier and the input of the second sine-to-square wave converter; and first and second resistors each having respective first and second terminals, the first and second resistors coupled between the first and second inputs of the fully differential amplifier.

28. The apparatus of claim 27, wherein:

the output of the first sine-to-square wave converter forms the output of the first loop circuit and is coupled to the respective first terminals of the first coupling capacitor and first inductor;

the first input of the fully differential amplifier forms the input of the first loop circuit and is coupled to the first terminal of the first resistor, the second terminal of the first coupling capacitor, and the first terminal of the first attenuator capacitor;

the output of the second sine-to-square wave converter forms the output of the second loop circuit and is coupled to the respective first terminals of the second coupling capacitor and second inductor;

the second input of the fully differential amplifier forms the input of the second loop circuit and is coupled to the first terminal of the second resistor, the second terminal of the second coupling capacitor, and the first terminal of the second attenuator capacitor; and the respective second terminals of the first and second resistors are coupled together and to the respective second terminals of the first and second attenuator capacitors.

* * * * *